(12) United States Patent
Umemura et al.

(10) Patent No.: US 6,600,790 B1
(45) Date of Patent: Jul. 29, 2003

(54) GAP-COUPLING BUS SYSTEM

(75) Inventors: Masaya Umemura, Hillsboro, OR (US); Hideki Osaka, Hiratsuka (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 09/297,359

(22) PCT Filed: Oct. 29, 1997

(86) PCT No.: PCT/JP97/03922

§ 371 (c)(1),
(2), (4) Date: Apr. 30, 1999

(87) PCT Pub. No.: WO98/19225

PCT Pub. Date: May 7, 1998

(30) Foreign Application Priority Data

Oct. 30, 1996 (JP) ............................................. 8-288366

(51) Int. Cl.⁷ ................................................ H04B 3/00
(52) U.S. Cl. ........................ 375/257; 710/100; 710/127
(58) Field of Search ........................ 375/257; 710/100, 710/107, 126, 128; 326/30; 333/109

(56) References Cited

U.S. PATENT DOCUMENTS

| | | | |
|---|---|---|---|
| 3,619,504 A | | 11/1971 | DeVeer et al. |
| 4,947,144 A | | 8/1990 | LeNohaic |
| 5,638,402 A | * | 6/1997 | Osaka et al. ................. 375/257 |
| 6,125,419 A | * | 9/2000 | Umemura et al. ........... 710/129 |
| 6,151,648 A | * | 11/2000 | Haq ............................ 710/107 |
| 6,297,663 B1 | * | 10/2001 | Matsuoka et al. ............ 326/30 |

FOREIGN PATENT DOCUMENTS

| | | |
|---|---|---|
| EP | 0727747 | 8/1996 |
| JP | 0371798 | 11/1991 |
| JP | 4156608 | 5/1992 |
| JP | 4181416 | 6/1992 |
| JP | 05299908 | 12/1993 |
| JP | 6161972 | 6/1994 |
| JP | 6250766 | 9/1994 |
| JP | 07141079 | 2/1995 |
| JP | 7066292 | 3/1995 |
| JP | 7141079 | 6/1995 |

* cited by examiner

*Primary Examiner*—Shuwang Liu
(74) *Attorney, Agent, or Firm*—Antonelli, Terry, Stout & Kraus, LLP

(57) ABSTRACT

There is provided a gap coupling type bus system, which makes it possible to mutually transfer data between all the modules connected to the bus. The gap coupling type bus system comprises for at least three modules, each module being provided with at least one sending/receiving circuit for sending and receiving a signal: at least three signal lines (21–26) respectively connected to the at least three modules (11–16); and terminating resistors (31–36) connected to respective signal lines at the other ends of the signal lines, each terminating resistor having generally same value as characteristic impedance of the signal line. Those at least three signal lines (21–26) have portions (1-2, 1-3, 2-3, ...) laid in parallel with one another with a predetermined gap, correspondingly to every combination of different two modules out of those at least three modules (11–16).

15 Claims, 17 Drawing Sheets

FIG. 5

| drive @ LSI | δT1 | | δT2 | | δT3 | | δT4 | | δT5 | | δT6 | |
|---|---|---|---|---|---|---|---|---|---|---|---|---|
| LSI1 | #2 | 1-2 | #4 | 1-4 | #6 | 1-6 | #5 | 5-1 | #3 | 1-3 | | |
| LSI2 | #1 | 1-2 | | | #4 | 2-4 | #6 | 2-6 | #5 | 5-2 | #3 | 2-3 |
| LSI3 | #4 | 3-4 | #6 | 3-6 | #5 | 3-5 | | | #1 | 1-3 | #2 | 2-3 |
| LSI4 | #3 | 3-4 | #1 | 1-4 | #2 | 2-4 | #1 | 5-1 | #6 | 6-4 | #5 | 5-4 |
| LSI5 | #6 | 5-6 | #3 | 3-6 | #3 | 3-5 | #2 | 2-6 | #2 | 5-2 | #4 | 5-4 |
| LSI6 | #5 | 5-6 | | | #1 | 1-6 | | | #4 | 6-4 | | | ns
GAP-COUPLING BUS SYSTEM

TECHNICAL FIELD

The present invention relates to a gap coupling type bus system for carrying out fast data transfer between functional components in an information processing unit.

BACKGROUND ART

As the conventional gap coupling (directional coupling) type bus system, there is such a bus system shown as non-contact type bus wiring described in Japanese Unexamined Patent Laid-Open No. 7-141079.

In this non-contact type bus wiring described in 7-141079, the bus system includes one and only bus master and many bus slaves. Each transmission line of the bus system shown in this literature is not connected directly with another line. Signal that passes one transmission line induces another transmission line to generate signal in that transmission line through so-called "cross talk noise" generation mechanism via inductive and capacitive couplings with predefined gaps. The latter signal, which is essentially cross talk noise, is demodulated to complete data transfer. To this end, the wiring is so constructed that the transmission line extended from the single bus master is terminated by a terminating resistor at its far end, and transmission lines connected to the plurality of bus slaves run.a certain length in parallel with the former transmission line.

Signal outputted from the bus master induces signal in every transmission line connected to respective bus slave, owing to the so-called "cross talk noise" generation mechanism, thus providing the same data to each bus slave.

On the other hand, signal outputted from a bus slave onto the transmission line connected thereto, induces signal in the transmission line connected to the bus master, owing to the cross talk noise generation mechanism. The bus master demodulates this signal to complete data transfer.

As described above, the non-contact type bus wiring described in 7-141079 can transfer data between a bus master and a plurality of bus slaves.

Now, data transfer among all the modules on a bus has become an ordinary matter, and, in terms of the non-contact bus wiring described in the above-mentioned 7-141079, data transfer from one bus slave to another bus slave is a prerequisite for employing the bus system in an information processing unit.

However, direct data transfer among the bus slaves has been difficult, since the transmission lines of the bus slaves are arranged to be connected indirectly with one another via the transmission line of the bus master. Namely, signal, i.e. so-called "cross talk noise", induced on the transmission line connected to the bus master is small in its amplitude, and even when this signal generates another signal on a transmission line connected to another bus slave, through cross talk noise generation mechanism, the resultant signal amplitude is minimum. To demodulate this signal, it is too small in its amplitude relatively to swing of power supply potential or with unnecessary radiant noise. Further, it is difficult for a demodulator circuit mounted on a bus slave or the bus master to attain required sensitivity. Thus, the prior art system is not suitable for data transfer between bus slaves, or, in other words, modern data transfer between all modules connected to a bus system.

Further, clock distribution in the conventional bus topology using, for example, TTL has its limit at some dozen MHz.

Accordingly, an object of the present invention is to provide a gap coupling type bus system that permits the mutual data transfer among all modules connected to a bus.

Another object of the present invention is to provide a gap coupling type bus system that can speed up clock distribution in bus topology.

DISCLOSURE OF THE INVENTION

A gap coupling type bus system according to the present invention is characterized in that it comprises, for at least three modules, each module being provided with at least one sending/receiving circuit for sending and receiving a signal: at least three signal lines respectively connected to the at least three modules, and terminating resistors connected to respective signal lines at the other ends of the signal lines, each terminating resistor having generally same value as characteristic impedance of the signal line, wherein the at least three signal lines have portions laid in parallel with one another with a predetermined gap, correspondingly to every combination of different two modules out of the at least three modules.

According to this construction, since, for each combination of different two modules out of at least three modules, there is a coupled portion via a gap, mutual data transfer is permitted between any modules, without having one as a master.

In this construction, the at least three signal lines are laid in a generally netlike pattern, by, for example, crossing one another in grade separation. In that case, it is preferable that said signal lines are laid in parallel at portions of crossing in grade separation. This realizes good gap couplings at those portions.

For example, the at least three modules are arranged in a line; the terminating resistors corresponding to these modules are arranged in parallel with the line of the modules at a distance from the modules; and each signal line is laid in a meander shape between each module and a corresponding one of the terminating resistor.

By such construction, each module can identify a module that outputted data, depending on difference in data arrival times.

In one embodiment, all the bus modules are arranged in a line (assumed to be a longitudinal direction), and signal lines connected to respective modules are drawn out laterally. When there are four bus modules for example, 1st and 2nd signal lines of those drawn-out signal lines are coupled via a gap, and 3rd and 4th are coupled via a gap, just after the drawing out. Next, before further drawing out the lines laterally, their order is changed to 2nd, 1st, 4th, and 3rd in the longitudinal direction, and after the drawing out, 1st and 4th are coupled via a gap. Before continuing to draw out laterally, their order is changed to 4th, 2nd, 3rd, and 1st, and after the drawing out, 2nd and 3rd are coupled via a gap. After the above couplings via a gap, the signal lines are connected to respective terminating resistors, to form a netlike pattern.

By thus forming the signal lines in a netlike pattern, every signal line can be coupled with all the other signal lines via gap, and data transfer between any bus modules can be realized.

As described above, the signal lines are laid in parallel with each other at a portion of grade separation. However, the signal lines may be laid such that, at some portions of the grade separation, the signal lines cross each other at a right angle. By this, wiring length contributing to that gap coupling between the signal lines becomes the minimum, and signal induced by the cross talk generating mechanism is very small. Thus, it is possible to use grade separation without accompanying the gap coupling, and wiring flexibility is enhanced.

Other gap coupling type bus system of the present invention is characterized in that each module and each terminating resistor corresponding to that module positioned at both ends of each signal line are arranged adjacently, and each of the at least three signal lines is laid in a loop or fold structure from the relevant module to the terminating resistor corresponding to that module.

For example, the at least three modules are arranged generally in a line, and the signal line of each module has portions laid in parallel with and adjacently to other signal lines successively in mid course of the wiring in the loop or fold structure from its own sending/receiving circuit to the corresponding terminating resistor.

In such construction, total length of each signal line in the loop or fold structure is generally same for any of the modules, and total length from a sending/receiving circuit of one module through the portions laid in parallel and adjacently, to a sending/receiving circuit of other module is generally same for every case.

By this, data outputted from whichever module arrives at target modules at the same time (simultaneous arrival). By this, data transfer cycle can be determined by delay time from start time of outputting signal to arrival and the number of repeated cycles for data. Thus, it is possible to easily realize a simple bus protocol, similarly to the conventional bus.

Still other gap coupling type bus system of the present invention is characterized in that, it comprises, for at least three modules, each module being provided with at least one sending/receiving circuit for sending and receiving a signal: at least three signal lines respectively connected to the at least three modules; and terminating resistors connected to respective signal lines at other ends of the signal lines, each terminating resistor having generally same value as characteristic impedance of the signal line; wherein, one of the at least three signal lines is a basic signal line, and signal lines of the modules other than the basic signal line are successively laid in parallel with the basic signal line with a predetermined gap to form stubs, and total length from a module having the basic signal line through the portion laid in parallel, and through other signal line forming the stub, to the other module is generally same, for any ones of the other modules.

By this construction of the present invention, it is possible to attain wiring of true bus topology having high speed property and constant propagation delay time for signals. In particular, it is possible to speed up clock distribution in the bus topology.

Other gap coupling type bus system according to the present invention is characterized in that, in the above-described bus system, the signal line connected with the sending/receiving circuit has two distribution conductors, a sending circuit of said sending/receiving circuit outputs an equivalent onto one of said two distribution conductors, and an inverted value onto the other of the two distribution conductors, depending on a logical value of an input of the sending/receiving circuit, and a receiving circuit of the sending/receiving circuit takes a form of a differential circuit that receives, as inputs, the equivalent of one of the two distribution conductors and the inverted value of the other, and outputs the logical value after demodulation.

Thus, by using two distribution conductors in a pair, as a signal line, and forming differential circuit, with one polarity being inverted, input amplitude of the differential circuit of the receiving side module is expanded to twice as large as the original amplitude, and designed sensitivity of the differential circuit can be relaxed. Further, even when the center of amplitude, i.e. ground potential swings due to some factor, the differential circuit can demodulate the signals without depending on the ground potential, and thus has an excellent noise insulating characteristic.

BRIEF DESCRIPTION OF DRAWINGS

FIG. 5 is a view showing data arrival times in LSIs constituting the gap coupling type bus system of the first embodiment of the present invention;

BEST MODE FOR CARRYING OUT THE INVENTION

Figure 1:
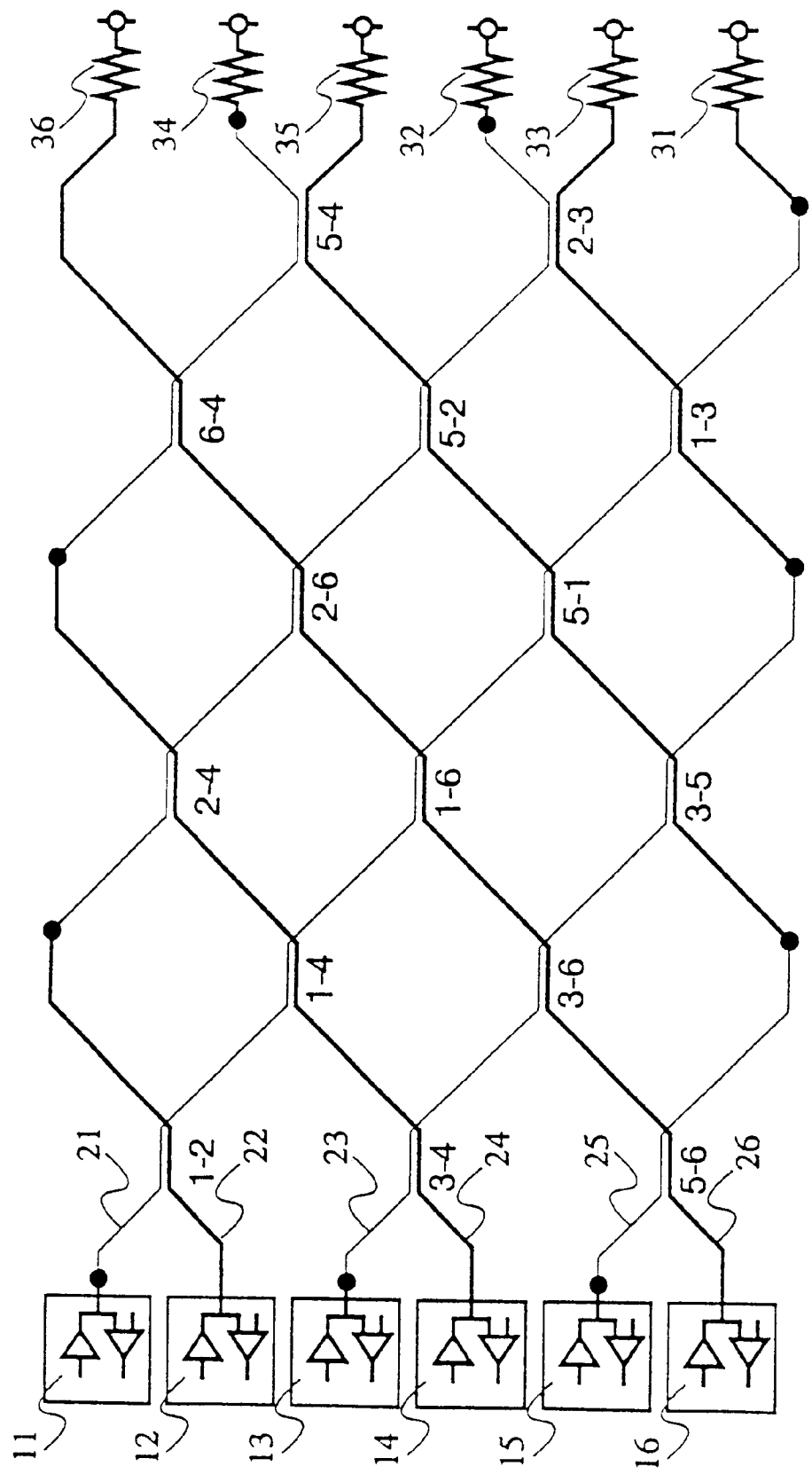
FIG. 1 is a view showing a gap coupling type bus system of a first embodiment according to the present invention.

A first embodiment of the gap coupling type bus system according to the present invention will be described referring to FIGS. 1–7. In the figures, the reference numerals 11–16 refer to LSIs connected to the gap coupling bus system of the present invention; 21–26 to distribution conductors in a printed circuit board, connecting with the above-mentioned LSIs respectively; 31–36 to terminating resistor connected with other ends of the distribution conductors 21–26 of the printed circuit board; 41*p*; 41*n*, and 43 to signals outputted by LSI of a bus master; 410*p*, 410*n*, 412, 413, 414, 415, 416, 431, 432, 434, 435, 436 to signals received by LSIs of a sink; 200*a*, *b* to signal layers of the printed circuit board; 200*g*1, *g*2 to ground layers of the printed circuit board; 200*v* to a power supply layer of the printed circuit board; 23*a*, 25*a*, 25*b*, and 26*b* to distribution conductors in the signal layers of the printed circuit board; and 200*ag*, 200*bg* to distribution conductors in the signal layers, for which potential is made to be ground potential.

FIG. 1 shows wiring of the gap coupling type bus system. Signal line, i.e., distribution conductor 21 of the printed circuit board connected to LSI 11, in the gap coupling type bus system, is connected to the terminating resistor 31 at the lower right of the figure. Similarly, distribution conductors 22–26 of the printed circuit board are connected to LSIs 12–16, and connected to terminating resistors 32–36 at the right end, respectively. Signal, which starts from LSI 11, propagates through the distribution conductor 21 of the printed circuit board, and induces signal in the distribution conductor 22 of the printed circuit board via a gap shown by 1-2, owing to so-called cross talk noise generation mechanism. Similarly, at 1-4, it induces signal in the distribution conductor 24 of the printed circuit board; at 1-6, signal in the distribution conductor 26; at 5-1, signal in the distribution conductor 25 of the printed circuit; and, at 1-3, signal in the distribution conductor 23, respectively. Last, the signal arrives at the terminating resistor 31, and disappears there. Among the induced signals, signals corresponding to so-called backward cross talks propagate toward LSIs 12–16 through the distribution conductors 22–26 of the printed circuit board, respectively, and are demodulated in LSIs 12–16, to complete data transfer.

In the wiring shown in FIG. 1, similarly to LSI 11, a signal outputted from any of LSIs 12–16, arrives at the other LSIs as the backward cross talk, to complete demodulated data transfer. Namely, this netlike wiring permits data transfer among all the LSIs.

Figure 2:
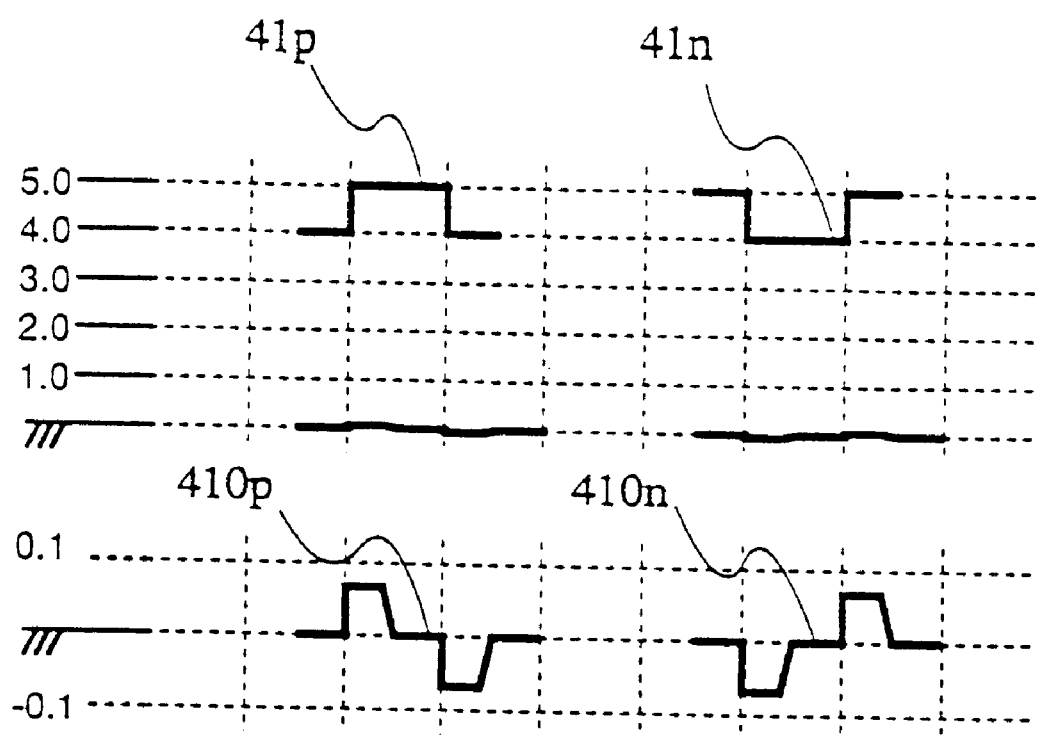
FIG. 2 is a view showing signal inducing mechanism of the gap coupling type bus system of the first embodiment of the present invention.

FIG. 2 shows signal outputted from LSI and backward cross talk noise received and demodulated. In the first embodiment of the present invention, output signal is 5 V at "H" level and 4 V at "L" level, which are output levels compatible with so-called P-ECL. This signal 41*p* induces amplitude 410*p* of 60–70 mV centering at GND level, as cross talk via the gap coupling between distribution conductors. As shown in the figure, 41*p* produces signal waveform 410*p*, and 41*n* produces signal waveform 410*n*.

Figure 3:
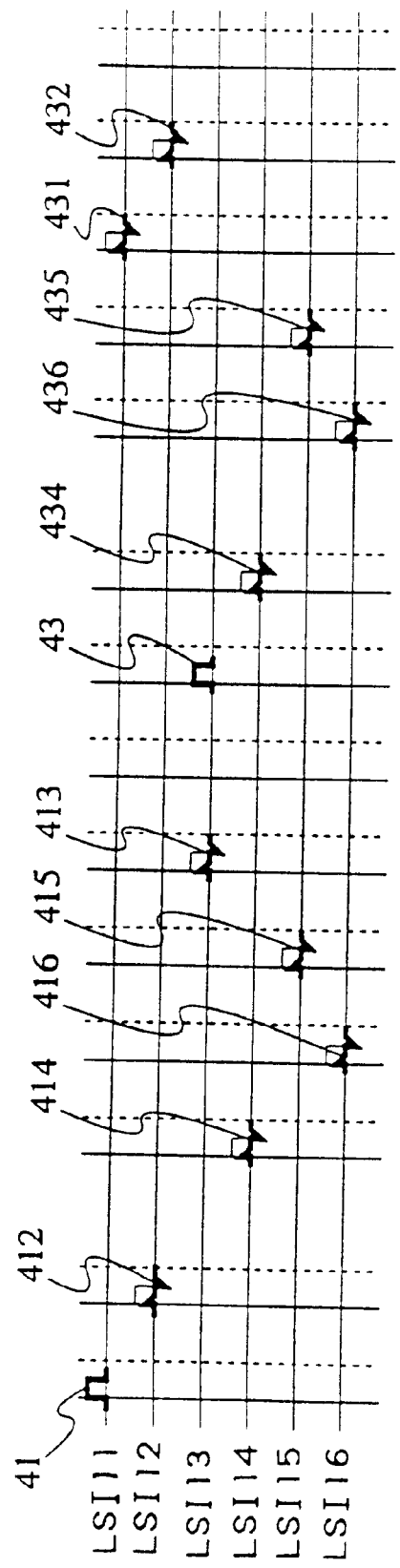
FIG. 3 is a view showing signal propagation in the gap coupling type bus system of the first embodiment of the present invention.

Propagation of the waveform produced by the mechanism of FIG. 2 is shown in FIG. 3. In FIG. 3, the horizontal axis indicates time series, and the vertical axis shows LSIs 11–16 successively from the top.

First, as shown, signal 41 outputted by LSI 11 induces 412 via 1-2, and 412 arrives at LSI 12. Then, the signal 41 induces 414 via 1-4, and 414 arrives at LSI 14. Next, the signal 41 induces 416 via 1-6, and 416 arrives at LSI 16, and then 41 induces 415 via 5-1, and 415 arrives at LSI 15. Then, the signal 41 induces 413, and 413 arrives at LSI 13.

Further, it is shown that, signal 43 outputted by LSI 13 induces 434 via 3-4, and 434 arrives at LSI 14. Then, the signal 43 induces 436 via 3-6, and 436 arrives at LSI 16. Next, the signal 43 induces 435 via 3-5, and 435 arrives at LSI 15, and then, the signal 43 induces 431 via 1-3, and 431 arrives at LSI 11. Then, the signal 43 induces 432 via 2-3, and 432 arrives at LSI 12.

Figure 4:
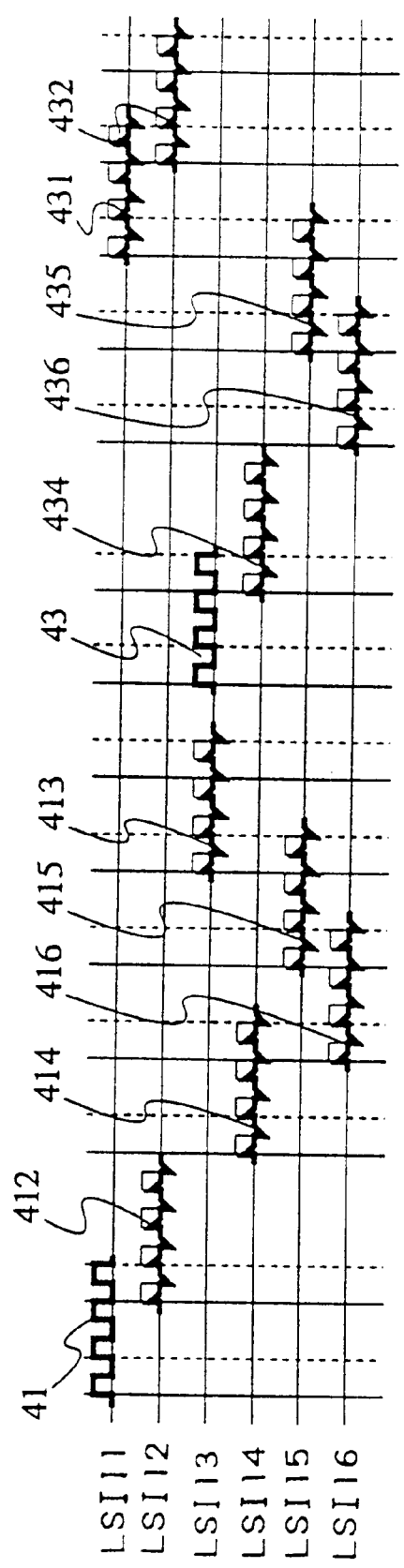
FIG. 4 is a view showing continuous signal propagation in the gap coupling type bus system of the first embodiment of the present invention.

FIG. 4 shows propagation in the case of successively outputting packets. Each of outputs 41, 43 of LSIs 11, 13 consists of successive packets. These outputs arrive as 412–416, and as 431, 432, 434–436, each having the same cycle as the successive packets 41, 43 (both in terms of a cycle of each lump of successive packets and in terms of a cycle of each packet of successive packets).

FIG. 5 shows arrival times of the data shown in FIGS. 3 and 4, arranging them according to LSIs receiving the data. It is characterized in that, in LSI 11, the data of LSI 12 arrives after δT1 from the start of a data transfer cycle, the data of LSI 14 after δT2, the data of LSI 16 after δT3, the data of LSI 15 after δT4, and the data of LSI 13 after δT5. From this characteristic, LSI 11 identifies LSI that outputted data, depending on which of δT1–δT5 is the arrival time of that data. Similarly, LSIs 12–16 are characterized in that data arrive between δT1–δT6 from the start of the data transfer cycle. From this characteristic, each LSI identifies LSI that outputted the data, depending on which of δT1–δT6 is the arrival time of that data. Thus, utilizing the difference in delay times for identifying a source ID (address), it becomes unnecessary to send the source ID.

Figure 6:
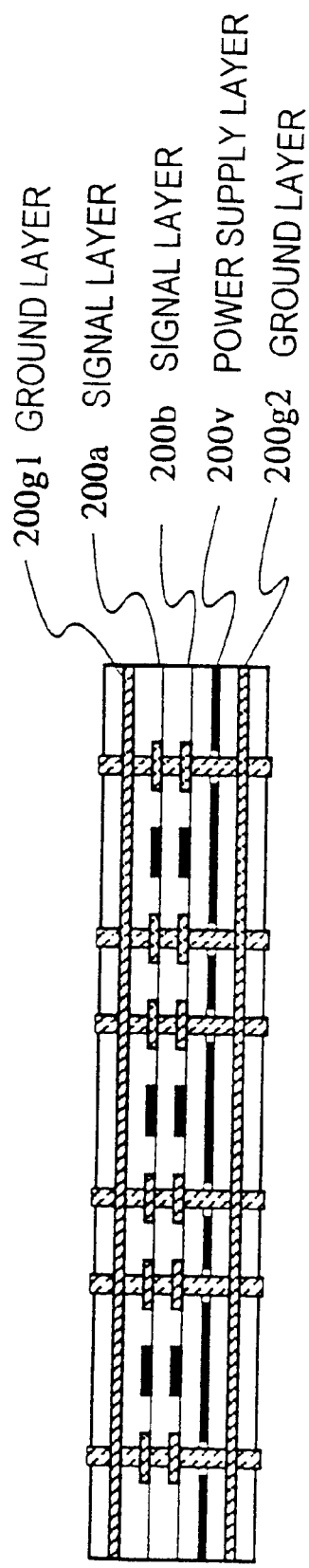
FIG. 6 is a view showing layer structure of a printed circuit board constituting the gap coupling type bus system of the first embodiment of the present invention.
Figure 7:
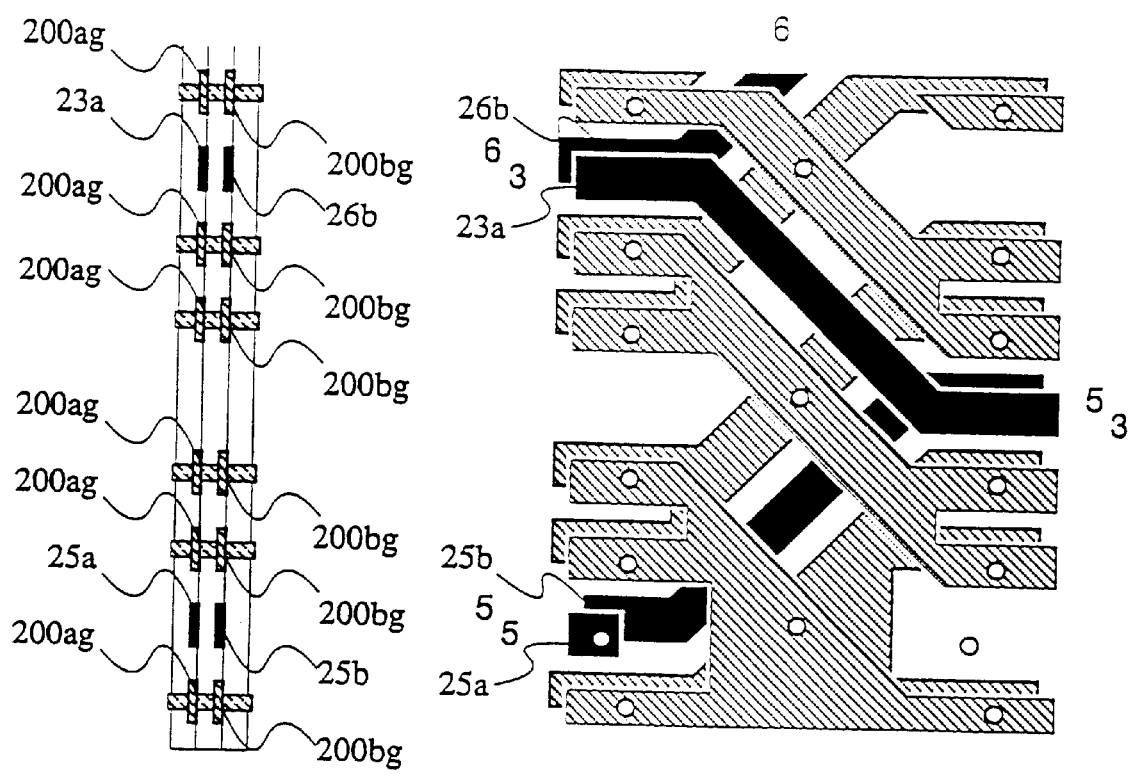
FIG. 7 is a view showing wiring in the printed circuit board constituting the gap coupling type bus system of the first embodiment of the present invention.

Referring to FIGS. 6 and 7, structure of the printed circuit used in the first embodiment of the present invention will be described. In the first embodiment of the gap coupling type bus system of the present invention, the distribution conductors 21–26 are distribution conductors of the printed circuit board. Using the printed circuit board, impedance and coupling coefficient between distribution conductors can be easily controlled, and high density packaging can be attained in wiring of required signal lines. As the distribution conductors for implementing the gap coupling type bus system of the present invention, one which is easily bent owing to its structure, such as a flat cable or flexible board, may be used instead of the printed circuit board.

FIG. 6 shows basic cross-sectional structure of the printed circuit board of the gap coupling type bus system of the present invention. The printed circuit board has the multi-layered structure as shown, and realized in such a manner that, distribution conductors are printed by etching or the like on a film made of glass epoxy or the like, and such films are laminated and adhered to each other. Instead of the lamination of the present invention, a board made up by the build-up process may be used to realize the gap coupling type bus system of the present invention.

Conductors of the laminated printed circuit board are a ground layer 200*g*1 coupled to the ground of the power supply, signal layers 200*a*, 200*b*, a power supply layer 200*v*, and a ground layer 200*g*2 coupled to the ground of the power supply, successively from the top layer. The signal layers 200*a*, 200*b* are covered with the ground layer 200*g*1 and the power supply layer 200*v* in the so-called "sandwich" manner. As a result of this structure, impedance of the signal layers 200*a*, 200*b* is defined by a gap between the ground layer 200*g*1 and the power supply layer 200*v*, and sizes of the signal layers 200*a*, 200*b*.

By arranging the ground layer 200*g*2, which is coupled to the ground of the power supply, under the power supply layer 200*v*, so-called feed system impedance is lowered.

This suppresses high speed signals that propagate through the signal layers 200*a*, 200*b*, in other words, unnecessary electromagnetic emission or radiation caused by current variation. Further, also the ground layer 200*g*1 suppresses high speed signals that propagate through the signal layers 200*a*, 200*b*, in other words, unnecessary electromagnetic emission or radiation caused by current variation. These power supply layer 200*v* and ground layers 200*g*1, 200*g*2 not only suppress the unnecessary electromagnetic emission or radiation but also prevent or shield from rushing-in of electromagnetic field from the external environment of the printed circuit board.

In the gap coupling type bus system of the present invention, the potential induced at the gap is weak, and accordingly is shielded by the power supply layer 200*v* and the ground layers 200*g*1, 200*g*2, preventing destruction of the propagating signal and malfunction of the system as a whole owing to this destruction.

FIG. 7 shows a part of wiring pattern of the distribution conductors in the printed circuit board of the gap coupling type bus system of the present invention.

A distribution conductor 23*a* of the printed circuit board is coupled with a distribution conductor 26*b* via a gap at the upper left in the figure. This gap is 3-6 in FIG. 1. Signal propagated through the distribution conductor 23*a* induces the distribution conductor 26*b*, or signal propagated through the distribution conductor 26*b* induces the distribution conductor 23*a*, so as to transmit the signal.

From this portion, the distribution conductor 26*b* goes obliquely toward the upper right, and the distribution conductor 23*a* goes obliquely toward the lower right.

A distribution conductor 25*a* of the printed circuit board is connected with a distribution conductor 25*b* through a via hole at the lower left in the figure. As a matter of fact, the distribution conductor 25*a* comes from the left and outside of the figure, and goes obliquely from the upper left to arrive at the via hole shown. From the via hole, the distribution conductor 25*b* goes obliquely toward the upper right, and coupled, via a gap, with the distribution conductor 23*a* which has gone obliquely toward the lower right. This gap is 3-5 in FIG. 1. These conductors 23*a*, 25*a* and 26*b*, 25*b* are laid in the signal layers 200*a* and 200*b*, respectively. A conductor 200*ag* is laid so as to surround the conductors 23*a*, 25*a* in parallel with them, and a conductor 200*bg* is laid so as to surround the conductors 26*b*, 25*b* in parallel with them. At portions where these 200*ag* and 200*bg* cross in grade separation, via holes are provided. By these via holes, 200*g*1, 200*g*2, 200*ag*, 200*bg* are connected with one another, and their potential is set to the ground potential. This grounding is called a guard pattern, and by this guard pattern, conductors 23*a* and 25*a*, for example, are separated from each other in their electromagnetic fields, thus excluding coupling within the same signal layer.

Figure 8:
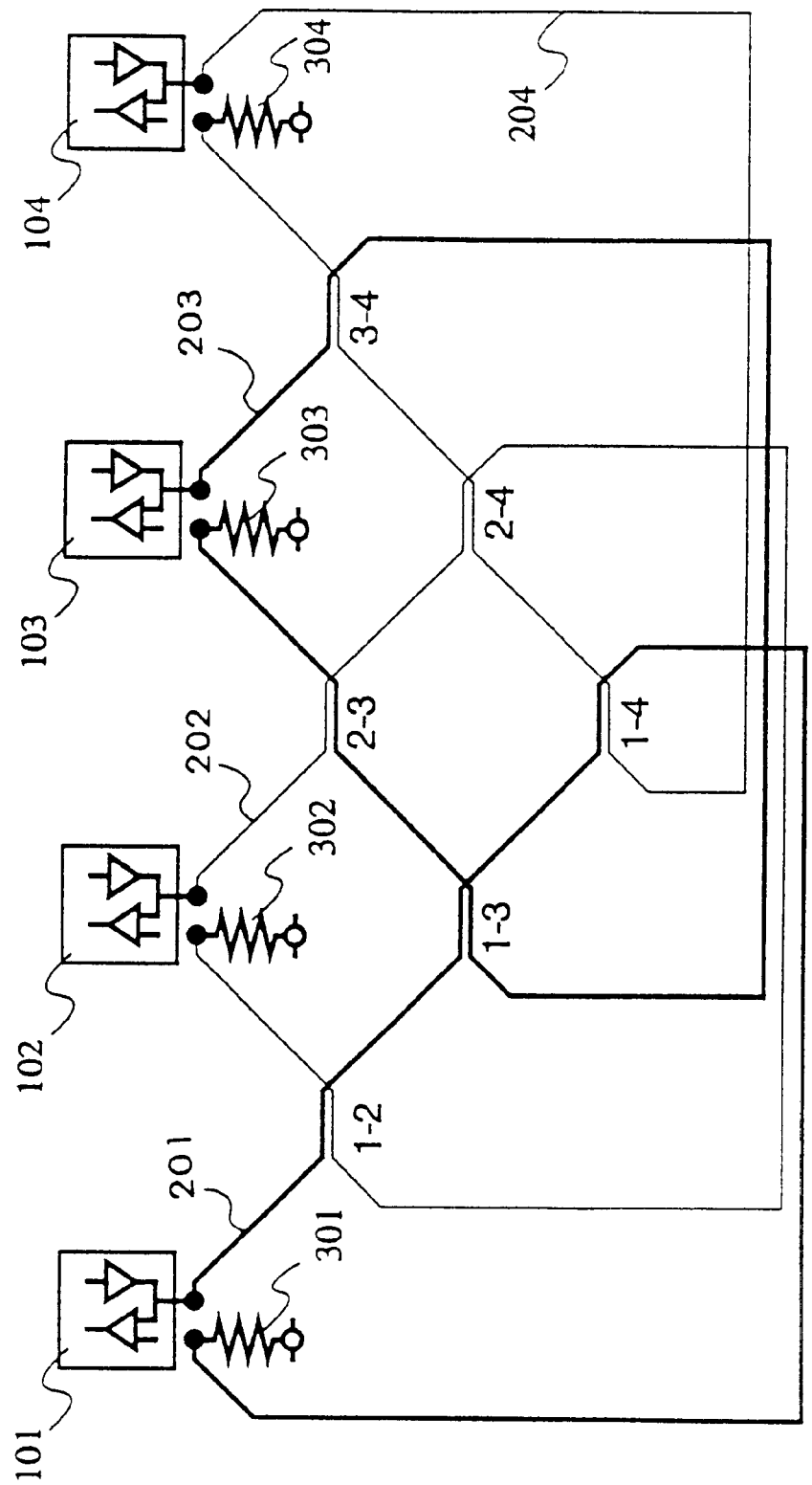
FIG. 8 is a view showing a gap coupling type bus system of a second embodiment according to the present invention.
Figure 9:
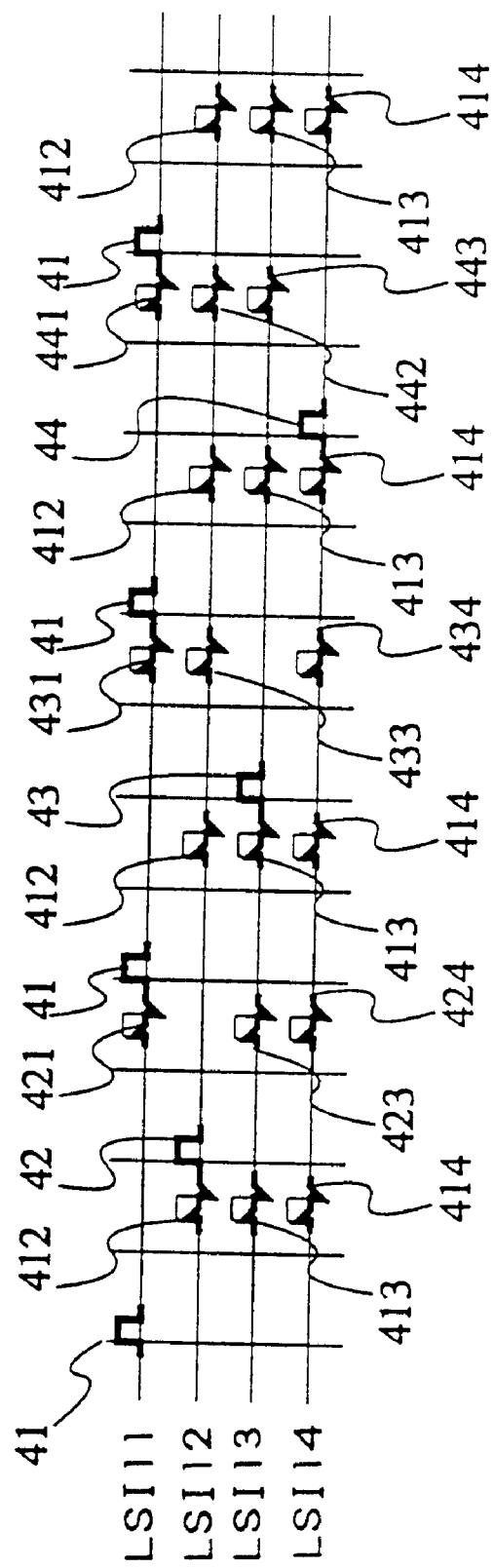
FIG. 9 is a view showing signal propagation in the gap coupling type bus system of the second embodiment of the present invention.

Referring to FIGS. 8 and 9, a second embodiment of the gap coupling type bus system of the present invention will be described. In the figures, reference numerals 101–104 refer to LSIs connected to the gap coupling type bus system of the present invention, 201–204 to distribution conductors of a printed circuit board connected to those LSIs respectively, 301–304 to terminating resistors connected to other ends of the distribution conductors 201–204 of the printed circuit board.

FIG. 8 shows wiring of the gap coupling type bus system of the second embodiment of the present invention. In the figure, LSI 101 connected to the gap coupling type bus system is connected to the distribution conductor 201 of the printed circuit board through signal line, and the distribution conductor 201 goes obliquely toward the lower right in the figure. In mid course, it passes by gaps with the distribution conductors 202, 203 and 204, and returns to the neighborhood of LSI 101. Its end portion is connected to the terminating resistor 301.

Similarly, LSI 102 is connected to the distribution conductor 202 of the printed circuit board, and the distribution conductor 202 goes obliquely toward lower right in the figure. In mid course, it passes by gaps with the distribution conductors 203, 204, turns in a loop shape, goes obliquely toward the upper right in the figure, passes by a gap with the distribution conductor 204, and returns to the neighborhood of LSI 102. Its end portion is connected to the terminating resistor 302.

LSI 103 is connected to the distribution conductor 203 of the printed circuit board, and the distribution conductor 203 goes obliquely toward lower right in the figure. In mid course, it passes by a gap with the distribution conductor 204, turns in a loop shape, goes obliquely toward the upper right in the figure, passes by gaps with the distribution conductors 201, 202, and returns to the neighborhood of LSI 103. Its end portion is connected to the terminating resistor 303. Wiring patterns of 202 and 203 are axisymmetric with each other.

LSI 104 is connected to the distribution conductor 204 of the printed circuit board with signal line. The distribution conductor 204 turns in a large loop shape, and thereafter, goes obliquely toward upper right in the figure. In mid course, it passes by gaps with the distribution conductors 201, 202, 203, and returns to the neighborhood of LSI 104. Its end portion is connected to the terminating resistor 304. Wiring patterns of 201 and 204 are axisymmetric with each other.

By such wiring, axisymmetric distribution conductors 202 and 203 are equal in their wiring length, as well as distribution conductors 201 and 204. Further, in the second embodiment of the present invention, the distribution conductors 201 and 202 are also laid to be equal in their wiring length. Namely, the distribution conductors 201–204 are equal in their wiring length one another.

When LSI 101 sends a signal, it first induces signal in the distribution conductor 202 at the gap shown as 1-2. Signal corresponding to backward cross talk of the induced signal starts to propagate toward LSI 102. Since amplitude of the signal propagating through the distribution conductor 202 is small, the signal arrives at and received by LSI 102 without inducing signals in the distribution conductors 204, 203 at the gaps of 2-4 and 2-3 on route.

In the second embodiment (FIG. 8) of the present invention, the length of this path from the distribution conductor 201 through the distribution conductor 202 to LSI 102 is equal to the total length of the distribution conductor 201, since the length from LSI 101 to the gap 1-2 is equal to the length from the terminating resistor 302 to the gap 1-2.

Next, the signal sent from LSI 101 induces signal in the distribution conductor 203 at the gap 1-3. Signal corresponding to backward cross talk of the induced signal starts to propagate toward LSI 103. Since amplitude of the signal propagating through the distribution conductor 203 is small, the signal arrives at and received by LSI 103 without inducing signals in the distribution conductor 204 at the gap of 3-4 on route.

The length of the path from the distribution conductor 201 through the distribution conductor 203 to LSI 103 is equal to the total length of the distribution conductor 201, since the length from LSI 101 to the gap 1-3 is equal to the length from the terminating resistor 303 to the gap 1-3.

Next, the signal sent from LSI 101 induces signal in the distribution conductor 204 at the gap 1-4. Signal corresponding to backward cross talk of the induced signal starts to propagate toward LSI 104. Signal that propagates through the distribution conductor 203 arrives at and received by LSI 103.

The length of the path from the distribution conductor 201 through the distribution conductor 204 to LSI 104 is equal to the total length of the distribution conductor 201, since the length from LSI 101 to the gap 1-4 is equal to the length from the terminating resistor 304 to the gap 1-4.

Thus, as described above, signals induced in respective distribution conductors 202–204 propagate the same distance as the total length of the distribution conductor 201, starting from LSI 101, and arrive at respective LSIs 102–104. Namely, the signal outputted from LSI 101 arrives at LSIs 102–104 at the same time.

The above description applies to the path of the distribution conductor 204 which is axisymmetric with the distribution conductor 201. Accordingly, signal sent from LSI 104 arrives at LSIs 101–103 at the same time.

When LSI 102 sends a signal, it first induces signal in the distribution conductor 203 at the gap shown as 2-3. Signal corresponding to backward cross talk of the induced signal arrives at and received by LSI 103.

The length of the path from the distribution conductor 202 through the distribution conductor 203 to LSI 103 is equal to the total length of the distribution conductor 202, since the length from LSI 102 to the gap 2-3 is equal to the length from the terminating resistor 303 to the gap 2-3.

Next, the signal sent from LSI 102 induces signal in the distribution conductor 204 at the gap shown as 2-4. Signal corresponding to backward cross talk of the induced signal arrives at and received by LSI 104.

The length of the path from the distribution conductor 202 through the distribution conductor 204 to LSI 104 is equal to the total length of the distribution conductor 202, since the length from LSI 102 to the gap 2-4 is equal to the length from the terminating resistor 304 to the gap 2-4.

Last, the signal sent from LSI 102 induces signal in the distribution conductor 201 at the gap shown as 1-2. Signal corresponding to backward cross talk of the induced signal arrives at and received by LSI 101.

The length of the path from the distribution conductor 202 through the distribution conductor 201 to LSI 101 is equal to the total length of the distribution conductor 202, since the length from LSI 102 to the gap 1-2 is equal to the length from the terminating resistor 301 to the gap 1-2.

Thus, as described above, signals induced in respective distribution conductors 201, 203, and 204 propagate the same distance as the total length of the distribution conductor 202, starting from LSI 102, and arrive at respective LSIs 101, 103, and 104. Namely, the signal outputted from LSI 102 arrives at LSIs 101, 103, 104 at the same time.

The above description applies to the path of the distribution conductor 203 which is axisymmetric with the distribution conductor 202. Accordingly, signal sent from LSI 103 arrives at LSI 101, 102, and 104 at the same time.

The total length of the distribution conductor 201 is equal to the total length of the distribution conductor 202, and accordingly, whichever LSI outputs a signal, signal to be received arrives at all the LSIs at the same time.

FIG. 9 shows a state of the simultaneous arrival. A signal 41 outputted by LSI 101 induces signals 412–414, and they arrive at respective LSIs 102–104 at the same time. This is same for each of LSI 102–104.

As shown in the second embodiment of the present invention, whichever LSI outputs a signal, data arrives at the same time with the same time interval. By this, data transfer cycle can be determined by delay time from start time for outputting a signal to arrival, and the number of repeated cycles for data. Thus, it is possible to easily realize a simple bus protocol, similarly to the conventional bus.

In the second embodiment, identification of a source ID is carried out by adding it to requesting data at the time of bus right arbitration, as in the ordinary bus system.

Figure 10:
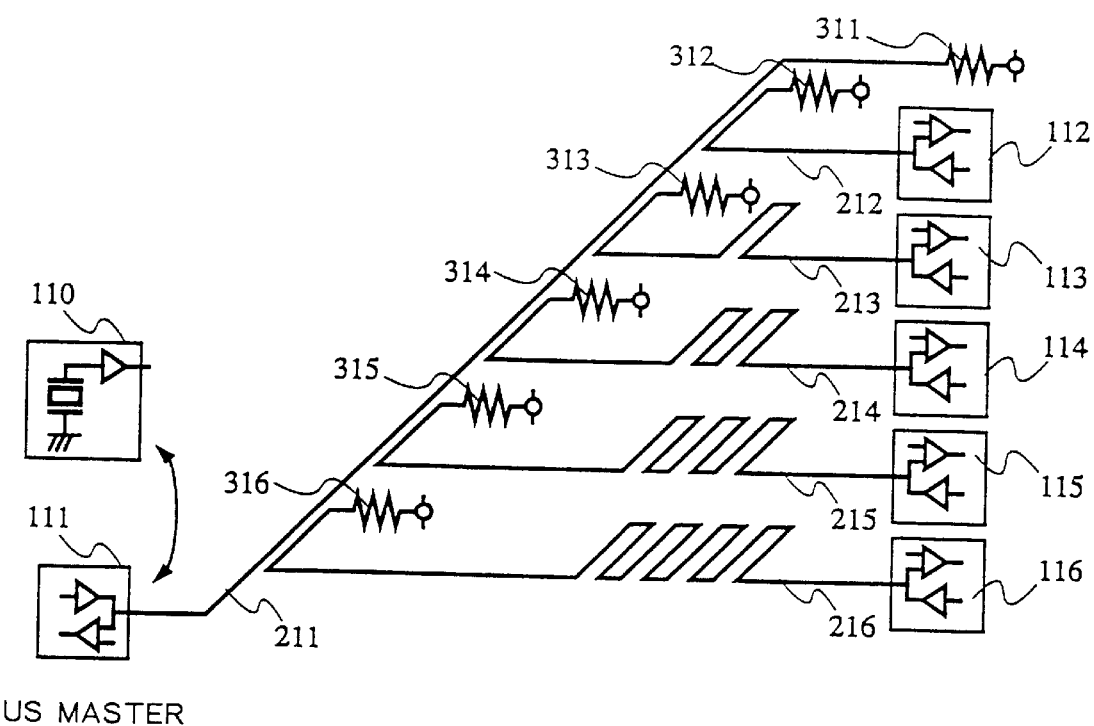
FIG. 10 is a view showing a gap coupling type bus system of a third embodiment according to the present invention.
Figure 11:
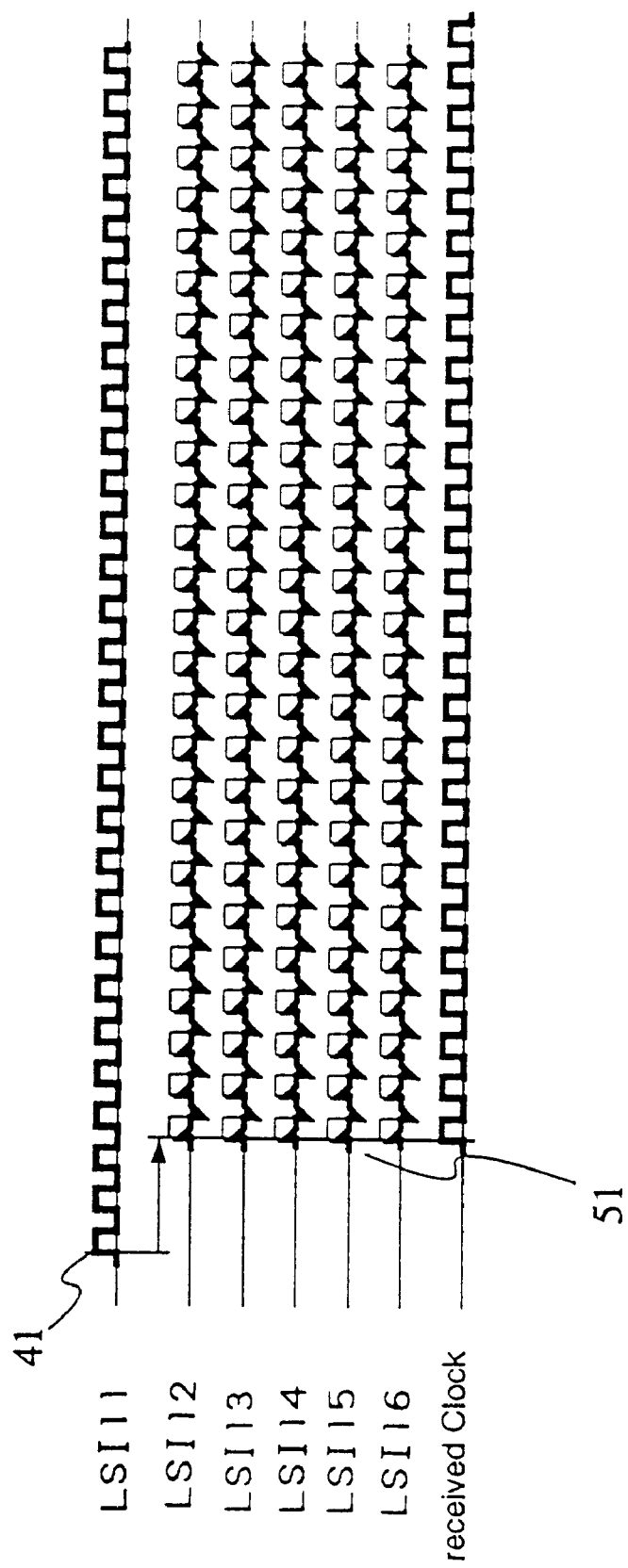
FIG. 11 is a view showing signal propagation in the gap coupling type bus system of the third embodiment of the present invention.

Referring to FIGS. 10, 11, a third embodiment of the gap coupling type bus system of the present invention will be described. In the figures, the reference numeral 110 refers to a crystal oscillator, 11 to LSI of a bus master, 112–116 to LSIs of bus slaves, 211 to a distribution conductor of a printed circuit board to which the bus master is connected, 212–216 to distribution conductors, and 51 to a signal received by LSI of a slave.

The distribution conductor 211 is coupled with the distribution conductors 216, 215, 214, 213, and 212 via gaps, and connected to a terminating resistor 311 at its end portion. To the distribution conductor 211, is connected the crystal oscillator 110 or LSI 111 of the bus master.

The distribution conductor 212 is connected with a terminating resistor 312 at its end portion, and with the slave LSI 112 at the other end portion.

The distribution conductor 213 is connected with a terminating resistor 313 at its end portion, and with the slave LSI 113 at the other end portion. The distribution conductor 213 is provided with a fold in mid course, to compensate difference in path length starting from the position of the master LSI 111 between the slave LSIs 112 and 113.

The distribution conductors 214–216 also have folds to compensate their differences in path length starting from the position of the master LSI 111, in comparison with the slave LSI 112.

By this arrangement, in the system connected with the crystal oscillator 110, clocks of the same phase arrive at the slave LSIs 112–116. By this, clock skew between the slave LSIs is decreased.

Further, in the system connected with the master LSI 111, a signal sent from the master LSI 111 arrives at the slave LSIs 112–116 at the same time, and data transfer cycle can be decided by delay time from start time for outputting a signal to arrival, and the number of repeated cycles for data. Thus, it is possible to easily realize a simple bus protocol, similarly to the conventional bus.

Further, a signal sent from any slave LSI arrives at the master LSI 111 with the same delay time. As for the master LSI, it becomes easy to set latching clock from effective time, i.e., a valid window for receiving signal, and thus, clock synchronous transfer is easily realized. By this, frame synchronization that is generally employed in a switching system or network router is easily realized by bus topology.

In the gap coupling type bus system of the present invention, true bus topology is realized such that the distribution conductor 211 connected to the bus master is a main line, to which distribution conductors 212–216 as a plurality of stubs are connected.

The conventional switching system or network router employs daisy chain in which one-to-one connection is used between respective interfaces, and protocol makes it behave as a bus system. Thus, protocol overhead is large, and quick transferability of transferred information is sacrificed.

The reason why bus system connection can not be employed is that settling time for signal potential is long owing to waveform distortion, preventing shortening of repeated frequency of signal.

When the gap coupling type bus system of the present invention is employed, signal waveform propagating through the distribution conductors 212–216 has no distortion, in spite of the distances from the slave LSIs to the distribution conductor 211 corresponding to a main line. Further, propagation that preserves uniform rise/fall and platform/depression is realized. In the distribution conductor 211 corresponding to the main line, signal is induced from this waveform, and accordingly, distortionless good signal arrives at the master LSI 111.

Although the construction of FIG. 10 has been described in relation to propagation of clock, bus wiring of the same construction as FIG. 10 can be used for data propagation.

According to the third embodiment of the present invention, it is possible to attain wiring of true bus topology having high speed property and constant propagation delay time for signals. The second embodiment has realized transfer between slaves and same data arrival time. The third embodiment realizes this same arrival time property in the conventional bus form.

FIG. 11 shows propagation of signals, in particular clock, when a clock oscillator is used. Output 41 of the clock oscillator arrives at the slaves LSI 112–116 with constant delay time, demodulated as clock, and used as clock for each slave LSI. Conventionally, clock distribution using, for example, TTL has limit at some dozen MHz. However, the gap coupling type bus system of the present invention allows clock distribution up to the maximum operation frequency of internal circuit such as an inverter of the slave LSI. This makes it unnecessary to use highly-multiplied output of PLL (Phase Lock Loop) frequently used for obtaining multiplied clock inside a slave LSI, or to use PLL itself. In particular, it is difficult to design PLL that attains high-frequency operation, high bandwidth/high precision/stable oscillation, or high multiplication. Further, packaging limitation is severe and it takes design man-hour and debug man-hour. Thus, functional simplification of PLL or exclusion of PLL contributes to shortening of product development and cost reduction.

Referring to FIGS. 12–15, a fourth embodiment of the gap coupling type bus system of the present invention will be described. In the figures, the reference numerals 121–124 refer to LSIs connected to the gap coupling type bus system of the present invention, 221p, n-224p, n to distribution conductors of a printed circuit board to which the above-mentioned LSIs are connected respectively, 321p, n-324p, n to terminating resistors connected to other ends of the distribution conductors 221p, n-224p, n of the printed circuit board, 410p, 410n, 41p, and 41n to signals outputted by LSI of a bus master, 51 to signal received by LSI of a sink, 223pa, 223pb, 223na, 223nb, 224na, 224pb, 221na, and 221pa to distribution conductors in signal layers of the printed circuit board.

Figure 12:
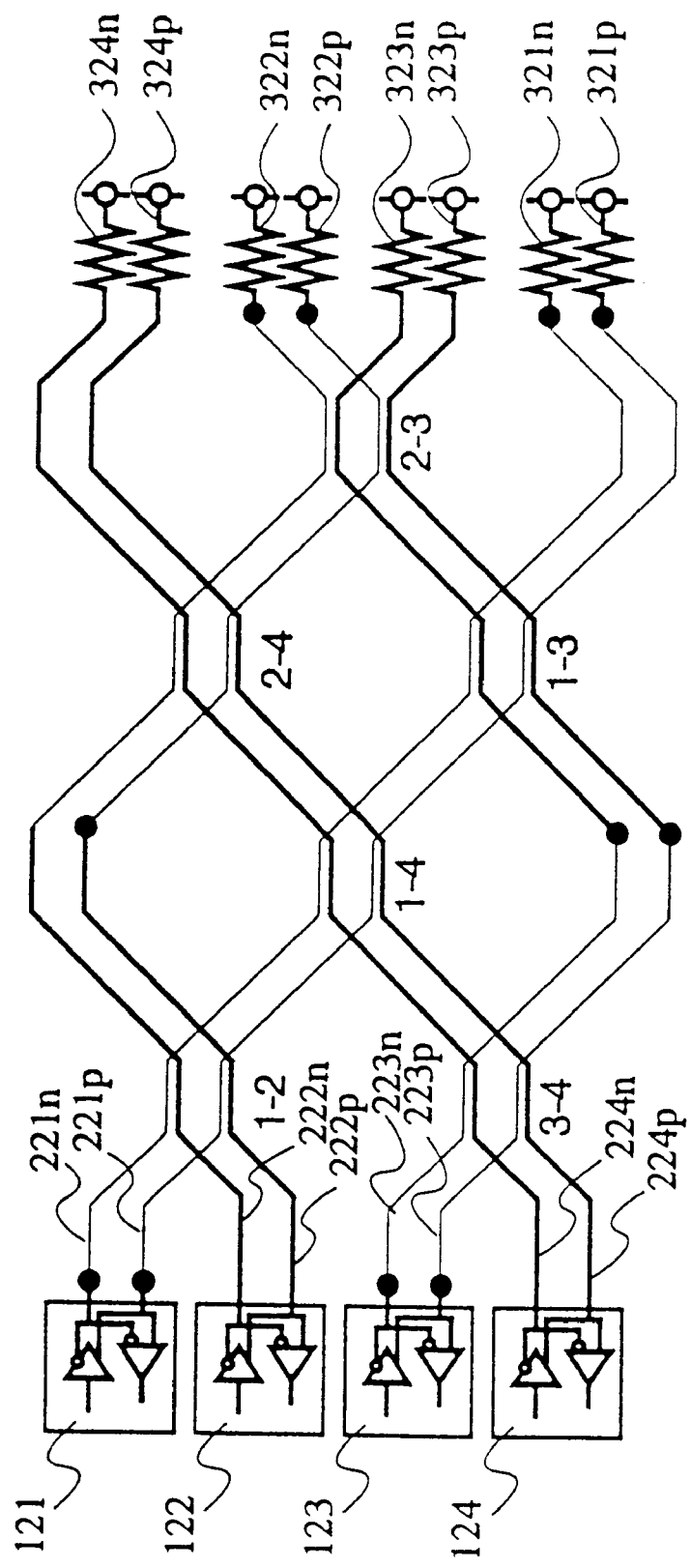
FIG. 12 is a view showing a gap coupling type bus system of a fourth embodiment according to the present invention.

FIG. 12 shows wiring of the gap coupling type bus system. LSI 121 that is connected to the gap coupling bus system is connected to the distribution conductors 221n, 221p of the printed circuit board through signal lines, the distribution conductors being connected to the terminating resistors 321n, 321p at the lower right in the figure, respectively.

On to the distribution conductors 221n, 221p, the same data having reverse polarity with each other, i.e., so-called differential signals are outputted.

Similarly, LSI 122–124 are connected with the distribution conductors 222n, 224p–224n, 224p of the printed circuit board, respective distribution conductors being connected to the terminating resistors 322n, 322p–324n, 324p at their right ends. Signal, which starts from LSI 121, propagates through the distribution conductors 221n, 221p of the printed circuit board, and induces signals in the distribution conductors 222n, 222p of the printed circuit board, via a gap shown as 1-2, owing to so-called cross talk noise generation mechanism. Similarly, signals are induced in the distribution conductors 224n, 224p of the printed circuit board at a gap 1-4, and in the distribution conductors 223n, 223p of the printed circuit board at a gap 1-3, last arriving at the terminating resistors 321n, 321p to be extinguished there. Among the induced signals, signals corresponding to backward cross talk propagate through the distribution conductors 22n, 22p–224n, 224p toward LSIs 122–124 respectively, and are demodulated in LSI 122–124 to complete the data transfer.

In the distribution conductors 222n, 222p–224n, 224p, differential signals induced by differential signals propagate, and are demodulated in LSIs 122–124 by differential comparators.

In the wiring shown in FIG. 12, similarly to LSI 121, signals outputted from whichever LSIs 122–124 arrive at the other LSIs as backward cross talk, and are demodulated to complete data transfer. Namely, this netlike wiring makes it possible to transfer data between all LSIs.

Figure 13:
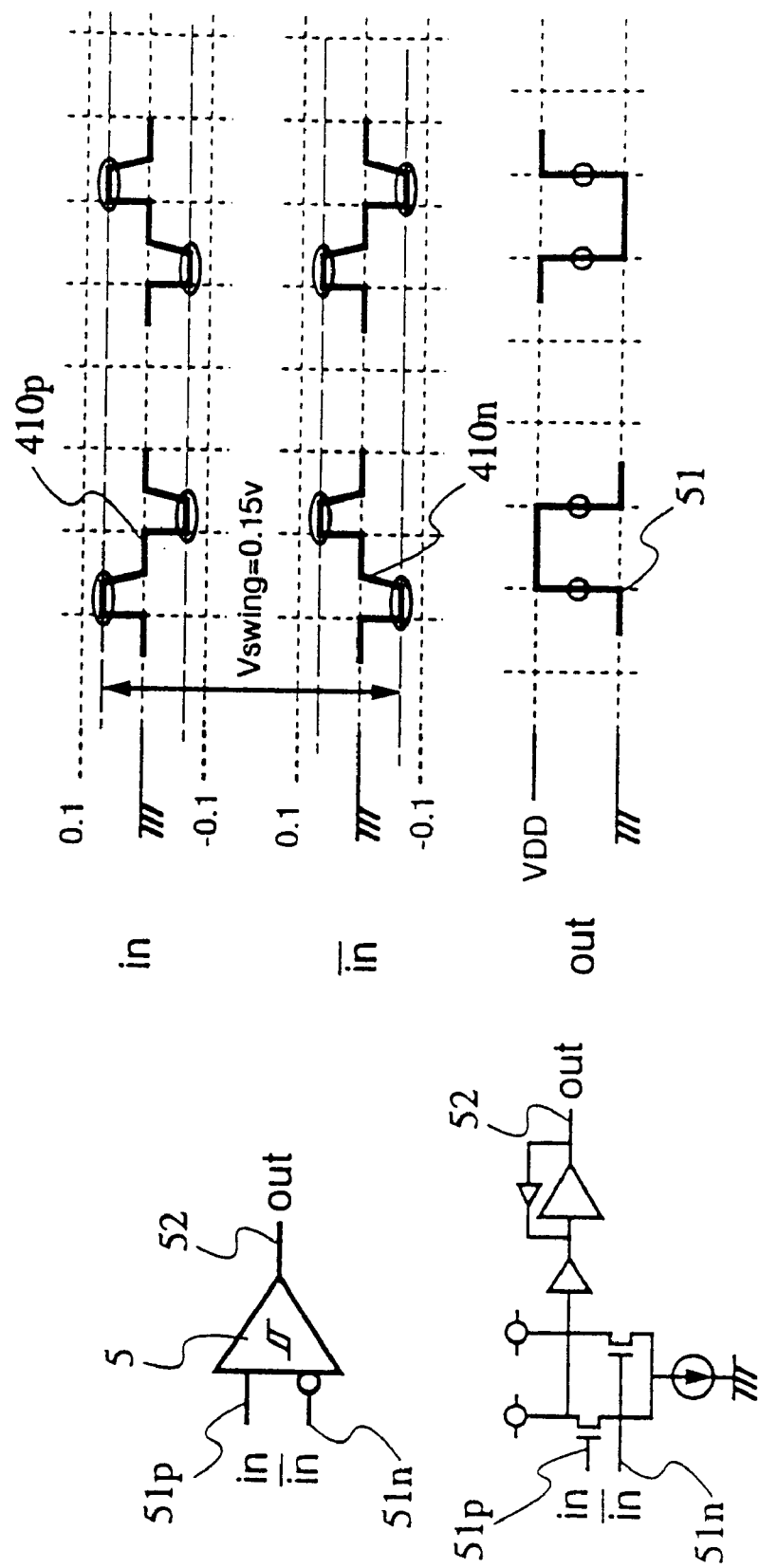
FIG. 13 is a view showing a relation between input and output of a differential comparator for demodulating signal of the gap coupling type bus system of the fourth embodiment of the present invention.

FIG. 13 shows signals outputted from LSI and backward cross talk noises received and demodulated. In the fourth embodiment of the present invention, outputted signal is about 5 V at "H" level and about 4 V at "L" level, which are output levels compatible with P-ECL. Signals outputted from LSI, for example LSI 121, are in a combination of "H", "L" or "L", "H" in order of 221p, 221n. These signals induce signals with amplitude of 60–70 mV centering at GND level, as cross talks via gap coupling between the distribution conductors of the printed circuit board. For example, in the case of "H", "L" in order of 221p, 221n, signals 410p, 410n are induced.

A comparator 5 shown in FIG. 13 has inputs 51p, 51n, and output 52. Taking an example of LSI 122, 51p is connected to the conductor 222p, and 51n to 222n. Signals in a combination of 410p, 410n are propagated through 222p, 222n, received by the differential comparator 5 of LSI 122, and demodulated to obtain signal 51 at "H" level.

In the fourth embodiment of the present invention, the amplitude induced in a distribution conductor is not different from the amplitude induced in the first-third embodiments of the present invention. However, two distribution conductors are paired to constitute differential circuit, with one polarity being inverted, so that input amplitude of a differential comparator of receiving LSI is expanded to 120–140 mV, twice as large as the original amplitude, and design sensitivity of the differential comparator can be relaxed.

Further, as for signals inputted into the differential comparator, even when the center of amplitude, i.e., ground potential swings due to some factor, the differential comparator can demodulate the signals without depending on the ground potential, and thus has an excellent noise insulating characteristic. In particular, in an information processing unit provided with the gap coupling type bus system of the present invention, a printed circuit board and power supply circuit have feed system impedance. When a steep variation of load occurs within the unit, current supplied by the printed circuit board or power supply circuit varies steeply, and, as a result, "floating-up" noise of ground potential called ground bounce is generated. As a cause of this load variation, are mentioned transition time from an idle or sleep state of CPU to an operating state, and transition time from power-down mode of a memory device to an operating state. Current change at such time is steep, reflecting an operation frequency of CPU or the memory device. Since band of an operation frequency of CPU or the memory device is close to the operation frequency of the gap coupling type bus system of the present invention, influence of the noise is large.

Figure 14:
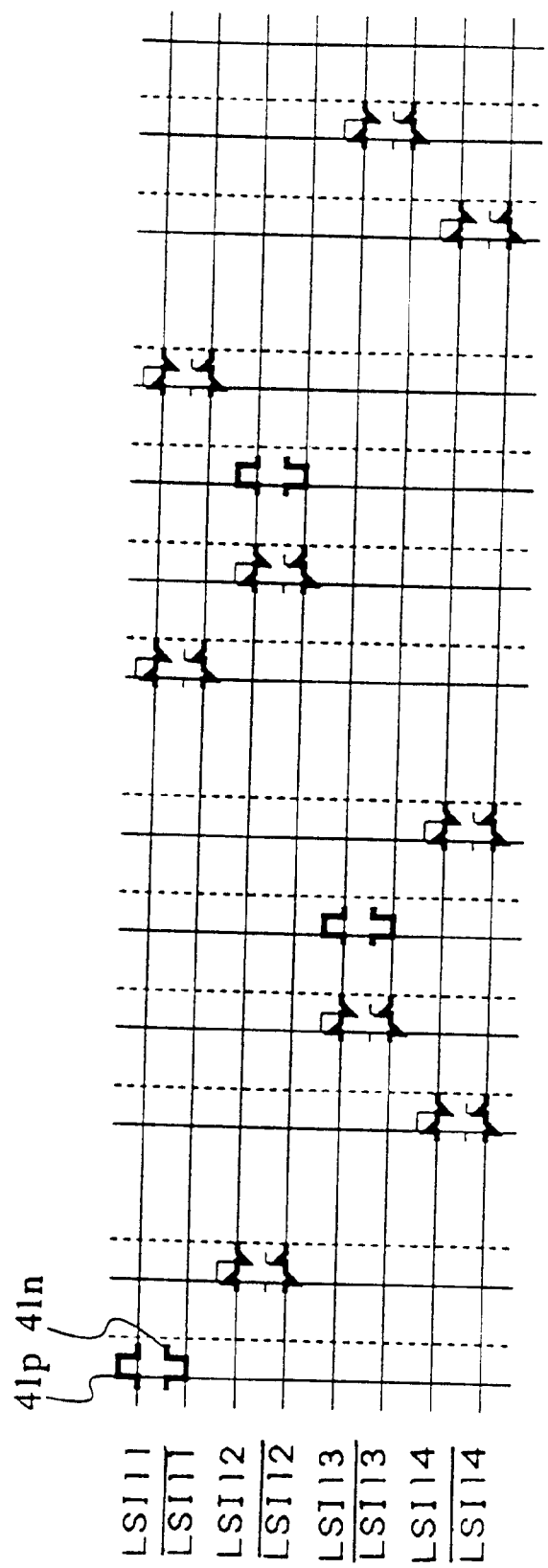
FIG. 14 is a view showing signal propagation in the gap coupling type bus system of the fourth embodiment of the present invention.

FIG. 14 shows propagation of waveform produced in accordance with the mechanism of FIG. 13. In FIG. 14, the horizontal axis indicates time series, and the vertical axis shows LSIs 121–124 successively from the top.

First, as shown, signals 41n, 41p outputted by LSI 121 induce 412n, 412p via 1-2, and 412n, 412p arrive at LSI 122. Then, the signals 41n, 41p induce 414n, 414p via 1-4, and 414n, 414p arrive at LSI 124. Next, the signals 41n, 41p induce 413n, 413p via 1-3, and 413n, 413p arrive at LSI 123.

Signals 43n, 43p outputted by LSI 123 induce 434n, 434p via 3-4, and 434n, 434p arrive at LSI 124, as shown. Then, the signals 43n, 43p induce 431n, 431p via 1-3, and 431n, 431p arrive at LSI 121. Next, the signals 43n, 43p induce 432n, 432p via 2-3, and 432n, 432p arrive at LSI 122.

Figure 15A:
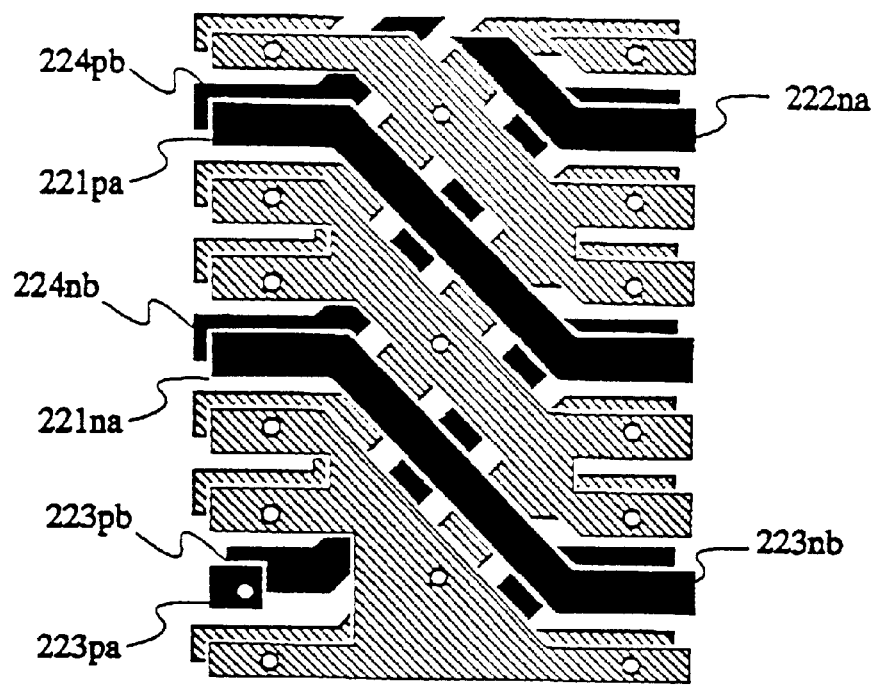
FIGS. 15A and 15B are views showing wiring in the printed circuit board constituting the gap coupling type bus system of the fourth embodiment of the present invention.

FIG. 15A shows a part of wiring pattern of the distribution conductors of the printed circuit board of the gap coupling type bus system of the present invention.

The distribution conductor 221pa of the printed circuit board is coupled with the distribution conductor 224pb at the upper left in the figure with a gap between them. This gap is 1-4 on the p-pole side, and signal propagated through the distribution conductor 223pa induces the distribution conductor 224pb, or signal propagated through the distribution conductor 224pb induces the distribution conductor 221pa, to transmit signal.

The distribution conductor 224pb goes obliquely toward the upper right from that point. The distribution conductor 221pa goes obliquely toward the lower right, crosses, in grade separation, the distribution conductor 224nb that goes toward the upper right, and thereafter continues going obliquely toward the lower right, to be coupled with the distribution conductor 223pb via gap.

The distribution conductor 223pa of the printed circuit board is connected to the distribution conductor 223pb through a via hole at the lower left in the figure. As a matter of fact, the distribution conductor 223pa comes from the left and outside of the figure, and goes obliquely from the upper left to arrive at the via hole shown. From this portion, the distribution conductor 223pb goes obliquely toward the upper right from the via hole, crosses, in grade separation, 221na that comes down obliquely from the upper right, and subsequently, is coupled, via a gap, with the distribution conductor 221na which has come obliquely toward the lower right. This gap is 1-3 on the p-pole side in FIG. 12.

In the left and middle portion, the distribution conductors 221na and 224nb are coupled with each other via a gap. This gap is 1-4 on the n-pole side in FIG. 12. The distribution conductor 224nb comes from the left and outside of the figure, and goes obliquely from the lower left to arrive at this gap. The distribution conductor 224nb continues going obliquely toward the upper right, crosses, in grade separation, the distribution conductor 221pa, and thereafter, continues going obliquely toward the upper right to be coupled with 222na via a gap.

These conductors 221pa, 221na, 222na, and 223pa are laid in the signal layers 200a, and conductors 224pb, 224nb, 223nb, and 223pb are laid in the signal layer 200b. A pattern is provided to surround the signal lines 221pa, 221na, 223na, 223pa, etc., and grounded through a via hole in the ground layer.

This grounding is called a guard pattern, and by this guard pattern, conductors 221pa and 223pa, for example, are separated from each other in their electromagnetic fields, thus excluding coupling within the same signal layer.

Figure 15B:
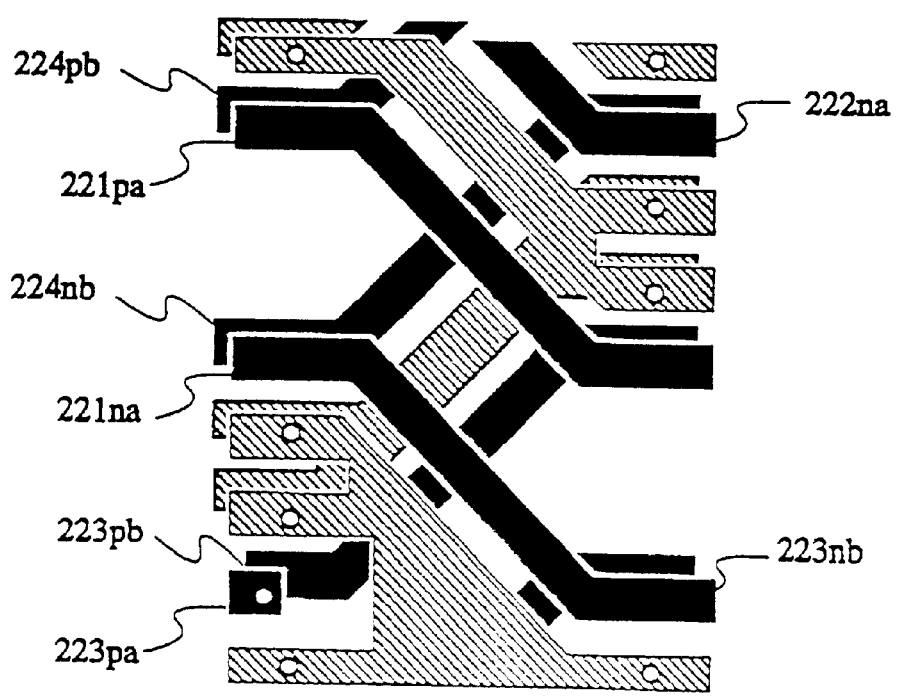

This guard pattern may be constructed as shown in FIG. 15B. Namely, the guard pattern is not provided between the signal lines 221pa, 221na of the same signal, and provided between 221na and 223pa, and between 222na and 221pa, i.e., between adjacent signals. Thus, the guard pattern is constructed so that it is not provided between p-channel and n-channel of the same signal, but provided between adjacent signals in the same layer. By this construction, electromagnetic coupling is strong between the lines of p-channel and n-channel of the same signal, and disturbance of impedance becomes small. In addition, in contrast with FIG. 15A, those lines are electromagnetically coupled between four signal lines in the gaps for generating cross talk, and, since cross talk is generated in each combination, desired signals can be induced.

Further, in the boards of FIGS. 15A and 15B implementing the gap coupling type bus system of the present invention, signal is induced, owing to the cross talk noise generation mechanism, at a portion where distribution conductors intersect each other. In the gap described above, pulse width of an induced signal depends on parallel wiring length of distribution conductors. In the embodiments of the present invention, this parallel wiring length is about 2–5 cm. This parallel wiring length is decided based on pulse width sensitivity of the differential comparator as an input circuit of LSI. When LSI process or processing accuracy such as 0.35 $\mu$m becomes finer in the future, pulse width sensitivity of the differential comparator is improved, and parallel wiring length can be shortened.

In FIGS. 15A and 15B, at portions where distribution conductors, for example 221pa and 224nb, or, 221na and 223pb, cross in grade separation between the signal layers, a crossing angle is a right angle in all cases. Owing to the crossing in grade separation at such a right angle, wiring length at that gap coupling between the distribution conductors becomes the minimum. Thus, signal induced by the cross talk noise generating mechanism becomes very small, and its pulse width becomes shorter than the sensitivity of the differential comparator and is ignored by the differential comparator.

Accordingly, the wiring pattern, shown in FIGS. 15A and 15B, of the distribution conductors of the printed circuit board of the gap coupling type bus system of the present invention realizes wiring that includes grade separation of the distribution conductors to be coupled and grade separation of the conductors not to be coupled.

In so-called differential circuit method shown in the fourth embodiment of the present invention, data transfer is performed in such a manner that 1 bit signal is outputted differentially, and demodulated by a differential comparator via a pair of distribution conductors. This differential circuit method can be applied to the second and third embodiments of the present invention. Further, in those cases, patterns of the printed circuit boards can be easily realized by providing gaps as grade separation crossing at a right angle or running in parallel.

Figure 16:
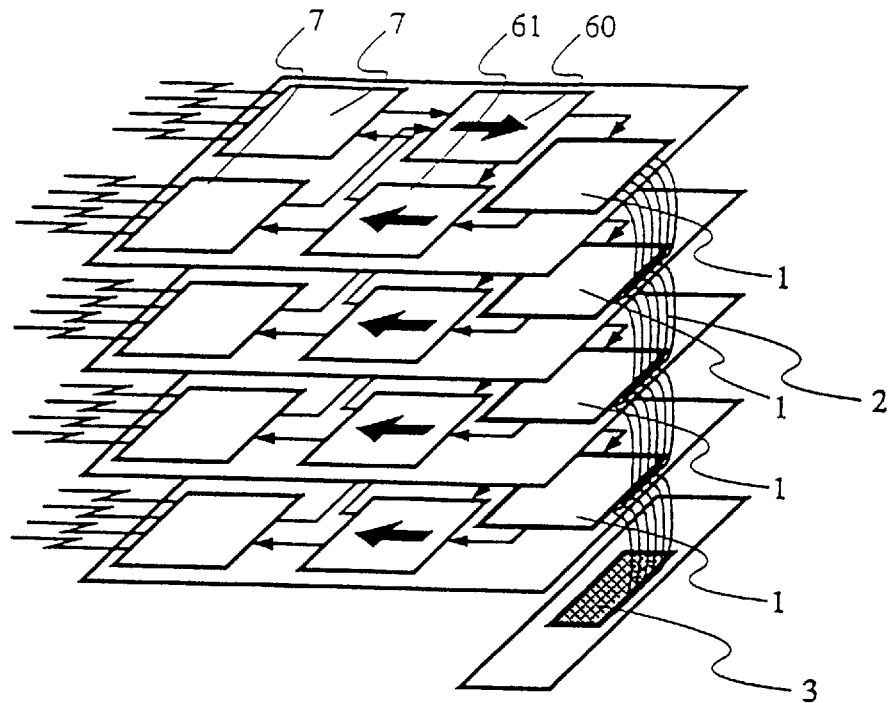
FIG. 16 is a view showing internal structure of a network router or electronic switching system having a back plane comprising cable furnished with the gap coupling type bus system of the embodiment of the present invention.
Figure 17:
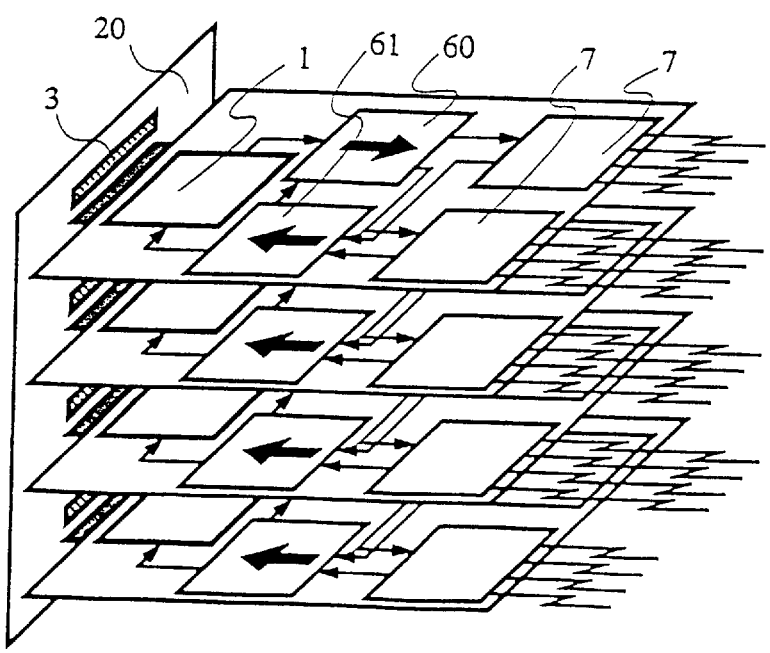
FIG. 17 is a view showing internal structure of a network router or electronic switching system having a back plane comprising printed circuit boards furnished with the gap coupling type bus system of the embodiment of the present invention.
Figure 18:
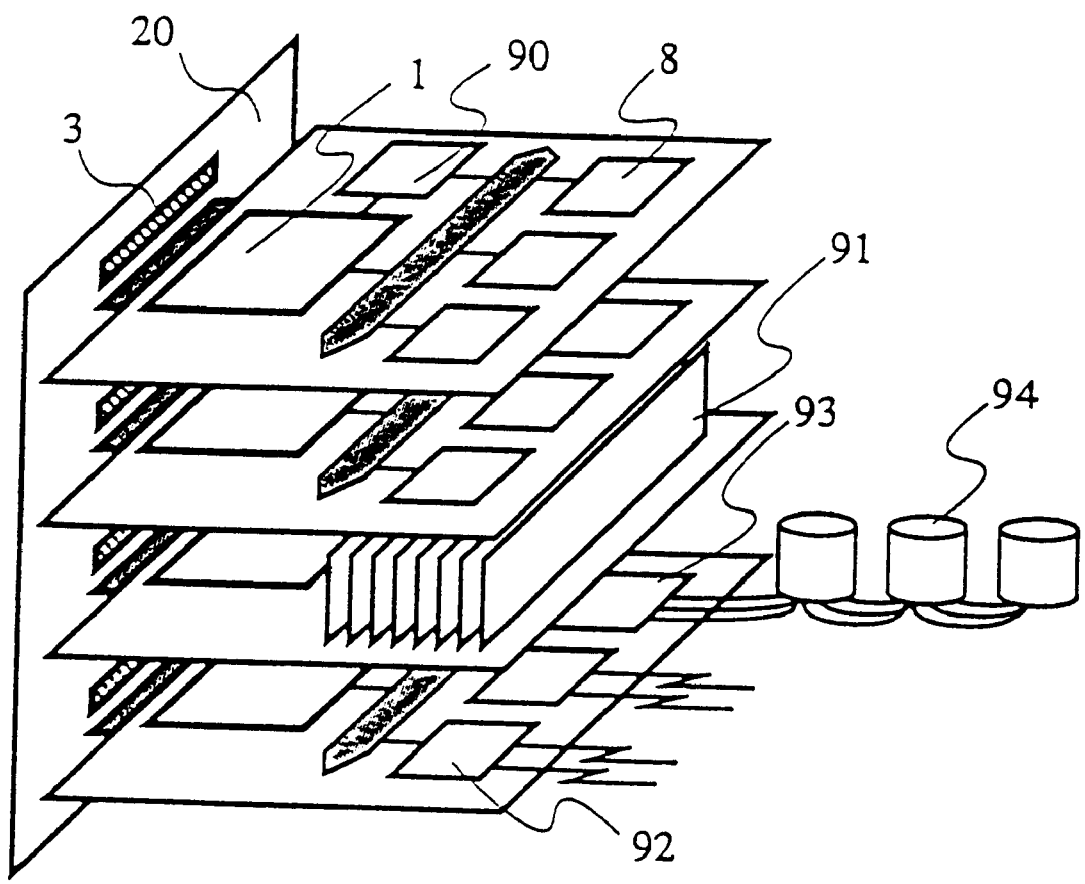
FIG. 18 is a view showing internal structure of a computer furnished with the gap coupling type bus system of the embodiment of the present invention.

Referring to FIGS. 16–18, an information processing unit provided with the gap coupling type bus system of the present invention will be described. In the figures, the reference numeral 1 refers to LSI connected to the gap coupling type bus system of the present invention, 2 to a cable constituting the bus system, 20 to conductors of a printed circuit board constituting the bus system or to that printed circuit board, 3 to (a group of) terminating resistors, 60 to a network router or processing LSI or a group of circuitries on the receiving side of an electronic switching system, 61 to a network router or processing LSI or a group of circuitries on the sending side, 7 to a network router or interface LSI or a group of interface circuitries on the network side of the electronic switching system, 8 to CPU constituting multiprocessor, 90 to cache memory or local memory and its controller, 91 to memory module constituting main memory, 92 to LSI or a group of circuitries of LAN interface, 93 to LSI or a group of circuitries of disk controller, and 94 to HDD.

FIGS. 16 and 17 show internal structure of a network router or electronic switching system.

Referring to FIG. 16, internal structure of the network router or electronic switching system having a back plane comprising a cable mounted with the gap coupling type bus system. In FIG. 16, the gap coupling type bus system of the present invention comprises LSI 1, a cable 2 constituting the bus system, and (a group of) terminating resistors 3. A plurality of (four in FIG. 16) LSIs 1 are connected to the cable 2 constituting the bus system, each LSI 1 being mounted on a separate printed circuit board. This printed circuit board is provided with processing LSI or circuitries 60 on the receiving side of the network router or electronic switching system, processing LSI or circuitries 61 on the sending side of the network router or electronic switching system, and interface LSI or interface circuitries 7 on the network side of the network router or electronic switching system.

The left side of the interface LSI or interface circuitries 7 on the network side of the network router or electronic switching system, is connected with general public telephone lines, or, optical fiber cables or metal cables (such as coaxial cables or twisted cables) of digital channels (such as private lines or frame relay switch) of the outside (i.e., LAN, WAN or ISDN for the network router, for example), to perform packet processing between networks and lines. In the case of the electronic switching system, that left side is connected with optical fiber cables or metal cables such as coaxial or twisted cables of subscriber lines, lines destined to other switching systems within a telephone office, or basic trunks destined to central telephone offices, to perform packet processing between lines, and thereby to perform switching between a plurality of layers such as subscriber line and basic trunk.

Operation will be described in detail. A packet received by the interface LSI or interface circuitries 7 on the network side of the network router or electronic switching system is separated into header and data of the packet by the processing LSI or circuitries 60 on the receiving side of the network router or electronic switching system. After the address shown in the header is analyzed, transfer destination of the packet is decided.

In the case that the transfer destination is a line or network connected to the interface LSI or interface circuitries 7 on the network side of the network router or electronic switching system, the packet is delivered from the processing LSI or circuitries 60 on the receiving side of the network router or electronic switching system to the processing LSI or circuitries 61 on the sending side of the network router or electronic switching system. There, its header is replaced with new header, and then, the packet is delivered to the interface LSI or interface circuitries 7 on the network side of the network router or electronic switching system, to which the relevant line or network is connected, to be sent therefrom.

In the case that the transfer destination is a line or network connected to the interface LSI or interface circuitries 7 on the network side of the network router or electronic switching system on another board, that packet is delivered to LSI 1. From that LSI 1, it is transferred to LSI 1 on other board via the cable 2 constituting the bus system. The packet outputted from the LSI 1 onto the cable 2 constituting the bus system is added with an address corresponding to a new address. LSI 1 on other printed circuit board assigned with this address delivers the received packet to processing LSI or circuitries 61 on the sending side of the network router or electronic switching system on the same printed circuit board. After the header is replaced with the new header, the packet is delivered to interface LSI or interface circuitries 7 of the network router or electronic switching system connected to the relevant line or network, and is sent therefrom.

In FIG. 16, the cable 2 constituting the bus system realizes clock feeding with very small clock skew, employing the gap coupling type bus system shown in the third embodiment of the present invention. Further, by employing the gap coupling type bus system shown in the first or fourth embodiment of the present invention, address indicating relevant LSI 1 among the LSIs 1 and the packet to be switched are propagated through the cable 2. The cable 2 includes transmission lines for clock, data packet, and address.

In FIG. 16, the cable 2 constituting the bus system realizes so-called back plane. Here, "back plane" means back plane bus which can perform bidirectional data transmission and is constructed by a flexible cable. The cable 2 may be constructed as FPC (Flexible Printed Circuit), for example.

Referring to FIG. 17, internal structure of the network router or electronic switching system having back plane comprising a printed circuit board furnished with the gap coupling type bus system will be described. For the sake of simplicity, description that overlaps FIG. 16 will be omitted.

In FIG. 17, LSI 1 is mechanically and electrically connected to distribution conductors of a printed circuit board constituting a bus system and to that printed circuit board 20, and distribution conductors connected to LSI 1 are terminated by terminating resistors 3 in the neighborhood of the LSI 1, thus realizing the gap coupling type bus system. Wiring of the conductors of the printed circuit board constituting the bus system and that printed circuit board 20 realizes clock feeding with very small clock skew by employing the gap coupling type bus system shown in the third embodiment of the present invention. Further, address indicating the relevant LSI 1 among the LSI 1 and the packet to be switched are propagated through the gap coupling type bus system shown in the second embodiment of the present invention.

By applying the gap coupling type bus system of the second embodiment of the present invention, a packet transferred from one LSI 1 to the other LSIs 1 arrives at those other LSIs at the same time. Owing to this simultaneous arrival, LSI having a right of outputting a packet in the next place, i.e. so-called bus right, can easily recognize an end of transfer cycle of the previous LSI 1. This shortens time for switching LSI 1 that outputs a packet, and more improves data transfer efficiency.

FIG. 18 shows internal structure of a computer furnished with the gap coupling type bus system.

In FIG. 18, LSI 1 is mechanically and electrically connected to distribution conductors of a printed circuit board constituting a bus system and to that printed circuit board 20, and distribution conductors connected to LSI 1 are terminated by terminating resistors 3 in the neighborhood of the LSI 1, thus realizing the gap coupling type bus system. Wiring of the conductors of the printed circuit board constituting the bus system and that printed circuit board 20 realizes clock feeding with very small clock skew by employing the gap coupling type bus system shown in the third embodiment of the present invention. Further, address indicating the relevant LSI 1 among the LSI 1 and data are propagated through the gap coupling type bus system shown in the second embodiment of the present invention.

As for the boards mounted with respective LSIs 1, two boards from the top are processor elements realizing multiprocessor, one under them is a memory riser card mounted with a memory module, and the lowest one is an I/O card mounted with network interface for LAN or the like, and a disk controller for connecting HDD via SCSI or Fibre Channel.

Each processor element is mounted with CPU 8, LSI 1 and cache memory 90, and they are connected with CPU bus. On the processor element, LSI 1 operates as a cache controller and controls the cache memory 90.

The memory riser card is mounted with LSI 1 and the memory module 91 constituting the main memory. LSI 1 operates as a memory controller and controls read and write of the memory module 91 constituting the main memory.

The I/O card is mounted with LSI 1, LSI 9 which is LAN interface, and a disk controller LSI or circuitries 93. LSI 1, LSI 9 of LAN interface, and the disk controller LSI or circuitries 93 are connected with I/O bus. Further, the disk controller LSI or circuitries 93 connects HDD 94 via SCSI or Fibre Channel.

Bus of the distribution conductors of the printed circuit board constituting the bus system and that printed circuit board 20 realizes clock feeding with very small clock skew to the processor elements, the memory riser card mounted with the main memory, and the I/O card. Further, address indicating the relevant LSI 1 among the LSIs 1 and a packet to be switched are propagated, employing the gap coupling type bus system shown in the second embodiment of the present invention.

The gap coupling type bus system shown in the second embodiment of the present invention realizes signal lines for information, such as coherency information of the cache, that needs to simultaneously arrive at the processor elements, the memory riser card, and the I/O card.

Industrial Applicability

The present invention can be applied to an information processing unit, and, in particular, is preferably used for producing its bus system.

What is claimed is:

1. A gap coupling type bus system, comprising at least three modules, each module being provided with at least one sending/receiving circuit for sending and receiving a signal;
at least three signal lines respectively connected to said at least three modules; and
terminating resistors connected to respective signal lines at other ends of the signal lines, each terminating resistor having generally same value as characteristic impedance of said signal line;
wherein:
said at least three signal lines have portions laid in parallel with one another with a predetermined gap, each signal line for one of the at least three modules being intertwined with the signal lines of the other at least three modules.

2. The gap coupling type bus system according to claim 1, wherein:
said at least three signal lines are laid in a generally netlike pattern, crossing one another in grade separation.

3. The gap coupling type bus system according to claim 2, wherein:
said signal lines are laid in parallel at portions of crossing in grade separation.

4. The gap coupling type bus system according to claim 1, wherein:
said at least three modules are arranged in a line,
said terminating resistors corresponding to these modules are arranged in parallel with said line of the at least three modules at a distance from said modules, and
each signal line is laid in a meander shape between each module and a corresponding one of said:terminating resistor.

5. The gap coupling type bus system according to claim 2, wherein:
said at least three modules are arranged in a line,
said terminating resistors corresponding to these modules are arranged in parallel with said line of the at least three modules at a distance from said modules, and
each signal line is laid in a meander shape between each module and a corresponding one of said terminating resistor.

6. The gap coupling type bus system according to claim 5, wherein:
said at least three modules are arranged in a line,
said terminating resistors corresponding to these modules are arranged in parallel with said line of the at least three modules at a distance from said modules, and
each signal line is laid in a meander shape between each modules and a corresponding one of said terminating resistor.

7. The gap coupling type bus system according to claim 2, wherein:
said signal lines are laid such that, at some portions of the grade separation, the signal lines cross each other at a right angle.

8. The gap coupling type bus system according to claim 1, wherein:
each module and each terminating resistor corresponding to that module positioned at both ends of each signal line are arranged adjacently, and
each of said at least three signal lines is laid in a loop or fold structure from each module to the terminating resistor corresponding to that module.

9. The gap coupling type bus system according to claim 8, wherein:
said at least three modules are arranged generally in a line, and
the signal line of each module has portions laid in parallel with and adjacently to the signal lines other than said signal line of each module successively in mid course of the wiring in the loop or fold structure from its own sending/receiving circuit to the corresponding terminating resistor.

10. The gap coupling type bus system according to claim 8, wherein:

length of each signal line in said loop or fold structure is generally same for any of said modules, and length of a path from a sending/receiving circuit of one module through said portions laid in parallel and adjacently, to a sending/receiving circuit of other module is generally same as the length of each signal line.

11. The gap coupling type bus system according to claim 9, wherein:

length of each signal line in said loop or fold structure is generally same for any of said modules, and length of a path from a sending/receiving circuit of one module through said portions laid in parallel and adjacently, to a sending/receiving circuit of other module is generally same as the length of each signal line.

12. A gap coupling type bus system, comprising at least three modules, each module being provided with at least one sending/receiving circuit for sending and receiving a signal;

at least three signal lines respectively connected to said at least three modules; and terminating resistors connected to respective signal lines at other ends of the signal lines, each terminating resistor having generally same value as characteristic impedance of said signal line;

wherein:

one of said at least three signal lines is a basic signal line, and signal lines of the modules other than said basic signal line are successively laid in parallel with said basic signal line with a predetermined gap to form stubs, each signal line for one of the at least three modules being intertwined with the signal lines of the other three modules, and length of paths of said basic signal line of a module through said signal lines laid in parallel, and through other signal lines forming said stubs, and said signal lines of said other modules are generally the same.

13. The gap coupling type bus system according to claim 1, further comprising two distribution conductors, wherein:

the signal line connected with said sending/receiving circuit has said two distribution conductors, depending on a logical value of an input of said sending/receiving circuit, a sending circuit of said sending/receiving circuit outputs an equivalent onto one of said two distribution conductors, and an inverted value onto the other of said two distribution conductors, and a receiving circuit of said sending/receiving circuit comprises a differential circuit that receives, as inputs, said equivalent of one of said two distribution conductors and said inverted value of the other, and outputs said logical value after demodulation.

14. The gap coupling type bus system according to claim 8, further comprising two distribution conductors, wherein:

the signal line connected with said sending/receiving circuit has said two distribution conductors, depending on a logical value of an input of said sending/receiving circuit, a sending circuit of said sending/receiving circuit outputs an equivalent onto one of said two distribution conductors, and an inverted value onto the other of said two distribution conductors, and a receiving circuit of said sending/receiving circuit comprises a differential circuit that receives, as inputs, said equivalent of one of said two distribution conductors and said inverted value of the other, and outputs said logical value after demodulation.

15. The gap coupling type bus system according to claim 12, further comprising two distribution conductors, wherein:

the signal line connected with said sending/receiving circuit has said two distribution conductors, depending on a logical value of an input of said sending/receiving circuit, a sending circuit of said sending/receiving circuit outputs an equivalent onto one of said two distribution conductors, and an inverted value onto the other of said two distribution conductors, and a receiving circuit of said sending/receiving circuit comprises a differential circuit that receives, as inputs, said equivalent of one of said two distribution conductors and said inverted value of the other, and outputs said logical value after demodulation.

* * * * *